United States Patent [19]

Hu

[11] 3,821,033

[45] June 28, 1974

[54] METHOD FOR PRODUCING FLAT COMPOSITE SEMICONDUCTOR SUBSTRATES

[75] Inventor: Shih-Ming Hu, Hopewell Junction, N.Y.

[73] Assignee: International Business Machines Corporation, Armonk, N.Y.

[22] Filed: Aug. 3, 1972

[21] Appl. No.: 277,531

[52] U.S. Cl. .......... 148/175, 117/106 A, 117/201, 117/215, 148/174, 317/235 R

[51] Int. Cl. ...... H01l 7/36, H01l 15/00, H05b 33/00

[58] Field of Search ........ 148/174, 175; 117/106 A, 117/201, 215; 252/62.3; 317/234, 235

[56] References Cited

UNITED STATES PATENTS

| | | | |
|---|---|---|---|
| 3,302,051 | 1/1967 | Galginaitis | 313/108 |
| 3,322,575 | 5/1967 | Ruehrwein | 148/175 X |
| 3,333,135 | 7/1967 | Galginaitis | 313/108 |
| 3,456,209 | 7/1969 | Diemer | 331/94.5 |
| 3,721,583 | 3/1973 | Blakeslee | 117/106 A X |

OTHER PUBLICATIONS

Abrahams et al., "Dislocation Morphology in Graded Heterojunctions: $GaAs_{1-x}P_x$," J. Materials Science, Vol. 4, 1969, p. 223–235.

R. H. Saul, "Defect Structure of GaP . . . Epitaxial Deposition," J. Electrochem. Soc., Vol. 115, No. 11, Nov. 1968, p. 1,184–1,190.

*Primary Examiner*—L. Dewayne Rutledge
*Assistant Examiner*—W. G. Saba
*Attorney, Agent, or Firm*—Daniel E. Igo; Wesley DeBruin

[57] ABSTRACT

A method for the deposition of single epitaxial films of ternary inorganic compounds formed from elements of Group III and V of the periodic system is described whereby warping or bowing of the deposited films is eliminated by a method comprising utilizing a non-linear intermediate transition or graded deposition region prior to the final formation of the constant composition single crystal epitaxial compound.

8 Claims, 3 Drawing Figures

METHOD FOR PRODUCING FLAT COMPOSITE SEMICONDUCTOR SUBSTRATES

BACKGROUND OF THE INVENTION

1. Field of the Invention

The subject invention relates to a method for producing single crystal epitaxial films of inorganic compounds. The epitaxial films which may be prepared in accordance with this invention are produced from volatile compounds of elements of boron, aluminum, gallium and indium of Group III of the periodic system and volatile compounds in elements of phosphorous, arsenic, antimony and bismuth of Group V of the periodic system. Examples of ternary compositions within the defined group are those having the formulae $GaAs_{1-X}P_X$ and $InAs_{1-X}P_X$ wherein X has a numerical value greater than zero and less than one.

The epitaxial films of this invention are characterized as graded energy gap crystals. A graded energy gap crystal is characterized by a non-uniformity of composition which results in a corresponding non-uniformity in the forbidden energy gap of a material. The non-uniformity of the forbidden energy gap may be one of gradual increase or decrease in a given direction in a linear or a non-linear manner, or any other type of profile. The range over which the forbidden energy gap can vary is governed by the elemental components that make up the crystal. Gallium arsenide phosphide characterized by the formula $GaAs_{1-X}P_X$ is widely used to produce red light emitting diodes. The material is typically vapor grown on a substrate of gallium arsenide to produce a composite structure. The composite includes the gallium arsenide substrate, a region of varying composition and a region of constant composition typically 38 percent phosphorous. The graded region is included to minimize the effects of the mismatch in the lattice spacing between the gallium arsenide substrate and gallium arsenide phosphide. The composition of the gallium arsenide phosphide is chosen to optimize the visual brightness of the final light emitting diode device by trading the decreasing device efficiency with the increasing phosphorous against increasing eye sensitivity. In spite of carefully chosen grading, the constant composition region is usually highly dislocated.

Because of the crystal lattice mismatch between gallium arsenide substrate material and the constant composition of gallium arsenide phosphide, the constant composition region must be grown on the top of a region of carefully compositionally graded material.

The III–V compounds of this invention are of high purity and have the necessary electrical properties for use as semiconductor components and are prepared by the reaction of a gaseous III compound such as a gallium halide and a gaseous V compound such as phosphorous halide in the presence of hydrogen.

2. Description of the Prior Art

The vapor deposition of III–V compounds is described in U.S. Pat. Nos. 3,218,205, 3,244,913 and 3,364,084. The manufacture of ternary III–V compounds utilizing a linear intermediate graded area in accordance with the prior art methods has produced composite wafers or slices which exhibit a concave bow or warp which makes subsequent processing and handling difficult as well as diminishes ultimate device yield. It was believed that the cause of the warping or bowing was due to the difference in thermal expansion of the binary substrate material and the ternary epitaxial single crystal deposition thereon to form a composite structure.

SUMMARY OF THE INVENTION

It is an object of this invention to provide a method for the vapor deposition of ternary III–V compounds upon a binary III–V substrate material in a manner such that the ultimate composite structure is substantially flat without bowing camber or other geometric deformity.

It is a further object of this invention to provide a method for improved light emitting semiconductor diode substrates having a substantially flat surface.

A still further object of this invention is to provide a new and economical method for the production of flat epitaxial wafers having a graded forbidden energy gap area.

The foregoing and other objects are accomplished by carrying out a process whereby an epitaxial ternary III–V compound such as gallium arsenide phosphide is deposited upon a binary III–V substrate material such as gallium arsenide utilizing a non-linear transition or graded zone from a composition such as gallium arsenide to gallium arsenide phosphide.

DESCRIPTION OF THE PREFERRED EMBODIMENTS

Figure 1:
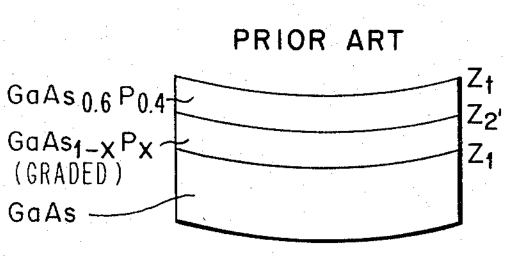
FIG. 1 is a side elevational view of a typical composite bowed prior art wafer illustrating the gallium arsenide substrate, an intermediate graded zone and the final constant composition zone.

Referring to the illustrative drawings, the III–V compounds of this invention are produced by combining in the vapor phase at least one volatile compound of Group III elements together with at least one volatile compound of Group V elements in the presence of hydrogen and contacting the resulting mixture with a binary III–V compound substrate whereupon a single crystal form of at least one III–V compound is deposited from the reaction mixture upon said substrate as an epitaxial film.

Gallium arsenide substrate crystal material either doped or undoped can be prepared or grown by a variety of methods of techniques. The most common involves the progressive, directional solidification of a molten semiconductor material from a starting seed crystal. The liquid is usually contained in a boat in contact with said single crystal seed. The solid-liquid interface is moved away from the seed by motion of the boat, movement of the temperature gradient profile, or by pulling the seed from the melt. These methods are often referred to as the Horizontal Bridgman Gradient Freeze and the Czochralski techniques.

In the Horizontal Bridgman method, crystals are grown in a sealed fused silica system in fused silica boats. The fused silica boat surfaces are usually sandblasted to produce a multi-faceted or disrupted surface in order to prevent wetting and avoid sticking or adhering of the produced material to the boat surface. Synthesis is usually performed from the elements in situ prior to growth. Usually, a two-zone furnace is employed to furnish two independently controllable temperature zones, one of which is at a higher temperature than the other. The hotter zone is controlled at a temperature above the melting point of the crystal to be grown. A thermal gradient of known characteristics is maintained at one end of this furnace. In practice, the boat containing the molten charge and a seed crystal of the desired orientation is situated in this gradient such that the point in the gradient corresponding to the melting temperature of the crystal is located at the point at which the solid-liquid interface is desired during the seeding of the melt. Relative motion of the boat with respect to the gradient results in directional freezing of the crystal.

The melt is usually comprised of a molten compound of the approximate stoichiometry of the crystal to be grown as a single crystal. The melt is usually held at a temperature above the melting point of the compound under an atmosphere of the more volatile element at a pressure approximately equal to the dissociation pressure of the compound at its melting point. T. S. Plaskett, et al., J. Electrochemical Society, Solid State Science, January 1971, pp. 115–117, describes the concept in relation to the production of gallium arsenide.

The cause of warping or bowing of gallium arsenide wafers after deposition of $GaAs_{1-X}P_X$ layers is due to lattice mismatch between layers of GaAs or $GaAs_{1-X}P_X$ of different compositions which causes stress and strains within the crystal structure. The stress can be partially relieved by the generation of misfit dislocations. However, at a given temperature, there is a critical yield stress below which no more plastic deformation takes place. Therefore, there will always be some residual stresses not exceeding the yield stress. It is the aforesaid residual stresses that are believed to cause warping or bowing of wafers.

The maximum deflection ($W_{max}$) of a circular wafer of radius $R$, or a long slab of major dimension R, is given by the formula:

$$W_{max} = -3R^2(2M - NZ_t)/Z_t^3$$

where $M$ and $N$ are the zeroth and the first moments of stress with respect to some neutral plane, $Z_n$, and $Z_t$ is the thickness of the wafer or the slab. For a composite structure consisting of a linearly graded zone sandwiched between two dissimilar constant composition zones such as gallium arsenide and gallium arsenide phosphide illustrated in FIG. 2, one can write $M$ and $N$, respectively, as a sum of three terms $$M = M_1 + M_2 + M_3$$

$$N = N_1 + N_2 + N_3$$

Figure 2:
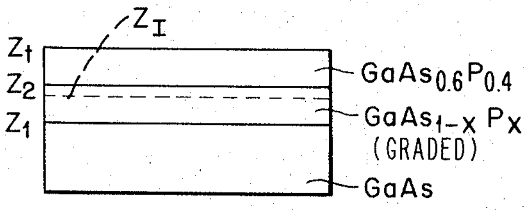
FIG. 2 is a side elevational view of a comparable composite flat III–V semiconductor wafer made in accordance with the disclosed invention.

Referring to FIG. 2, the substrate of gallium arsenide is denoted as zone 1 where the thickness is $0$–$Z_1$ and $X = 0$. The graded area can be designated as zone 2 having a thickness $Z_1$ to $Z_2$ where $X = Z - Z_1/Z_2 - Z_1X'$ and the ultimate constant composition zone 3 is $Z_2$ to $Z_t$ where $X = X'$. Subscripts 1, 2 and 3 denote, respectively, contributions from lattice mismatch, misfit dislocations, and thermal contraction during cooling.

It is known for the structure as illustrated in FIG. 2 that:

$$N_1 = (a_2 - a_1/a_1)\,[Z_t - 1/2(Z_1 + Z_2)],$$

$$M_1 = (a_2 - a_1/a_1)\,[1/2Z_t^2 - 1/6(Z_1^2 + Z_1 Z_2 + Z_2^2)];$$

$$N_2 = -1/2[a_2 - a_1/a_1\,(Z_2 - Z_c/Z_2 - Z_1)\,(Z_1/Z_c)^2 + 4\sigma_c(1-v)/E\,Z_2 - Z_c/Z_c]\,(2Z_t - Z_2 - Z_c) + \sigma_c(1-v)/E\,[Z_t ln(Z_2/Z_c)^2 - 2(Z_2 - Z_c)]$$

$$M_2 = -1/6[a_2 - a_1/a_1\,Z_2 - Z_c/Z_2 - Z_1(Z_1/Z_c)^2 + 4\sigma_c(1-v)/E\,Z_2 - Z_c/Z_c]\,[2\,(Z_2 - Z_c)^2 + 3Z_c(Z_2 - Z_c) + 3(Z_t^2 - Z_2^2)] + \sigma_c(1-v)/2E\,[Z_t^2 ln(Z_2/Z_c)^2 - Z_2^2 + Z_c^2]$$

Where $$Z_c \cong Z_1 + (Z_2 - Z_1)\,\sigma_c(1-v)a_1/E(a_2 - a_1)$$

In general, the thermal expansion coefficient is not linear with composition $X$; rather it can be represented as $$\alpha\,(X) = k_1 + k_2X/k_3 + X$$

where $\sigma_c$ is the critical yield stress above which plastic deformation will take place and $v$ is Poisson ratio and $E$ is the modulus of elasticity while $k_1$, $k_2$, and $k_3$ are appropriate constants. $a_1$ and $a_2$ are lattice parameters for corresponding compositions $X_1$ $X_2$.

However, a linear approximation can be made without incurring significant error where $M_3$ and $N_3$ are obtained by replacing $(a_2 - a_1)/a_1$ in the first two above equations with $(\alpha_2 - \alpha_1)\,\Delta T$, where $\alpha_1$ and $\alpha_2$ are the thermal expansion coefficients in Zone 1 and Zone 3, respectively, and $\Delta T$ is the difference between the epitaxial temperature and the room temperature. In typical cases, the contribution to $W_{max}$ from $N_2$ and $M_2$ is about 90–95 percent of that by $N_1$ and $M_1$, meaning that the compensation of strain due to lattice mismatch by misfit dislocations is not complete. It is this residual strain which still exceeds that compensation by thermal contraction represented by $N_3$ and $M_3$, that causes the bowing of epitaxial $GaAs_{1-X}P_X$ wafers.

Bowing can be minimized in a number of ways based upon the principle of compensation by misfit dislocations. For example, one can reduce the thickness of the graded zone. As $Z_2 \rightarrow Z_1$, and hence $Z_c \rightarrow Z_1$, which results in the following equations $$N_1 = -N_2 = (a_2 - a_1/a_1)\,(Z_t - Z_1)$$

$$M_1 = -M_2 = 1/2\,(a_2 - a_1/a)\,(Z_t^2 - Z_1^2)$$

there is consequently a complete compensation of lattice mismatch by misfit dislocations. However, it should be emphasized that a more harmful type of dislocations, referred to as inclined dislocations that tend to increase inversely proportionally to the width of the graded zone. Inclined dislocations are discussed and defined in the literature, eg. M. S. Abrahams, L. R. Weisberg, C. J. Binocci, and J. Blanc, J. Materials Sci. 4, pp. 223–235 (1969). It is believed that the concentration gradient in the linear zone ($\Delta C/\,\Delta X$) should not exceed 0.01 per millimicrons which means that typically, for $X$ going from 0 to 0.40, approximately some 40 millimicrons of graded zone is necessary for good quality epitaxial film. This consequently means an incomplete compensation of lattice mismatch by misfit dislocation.

Figure 3:
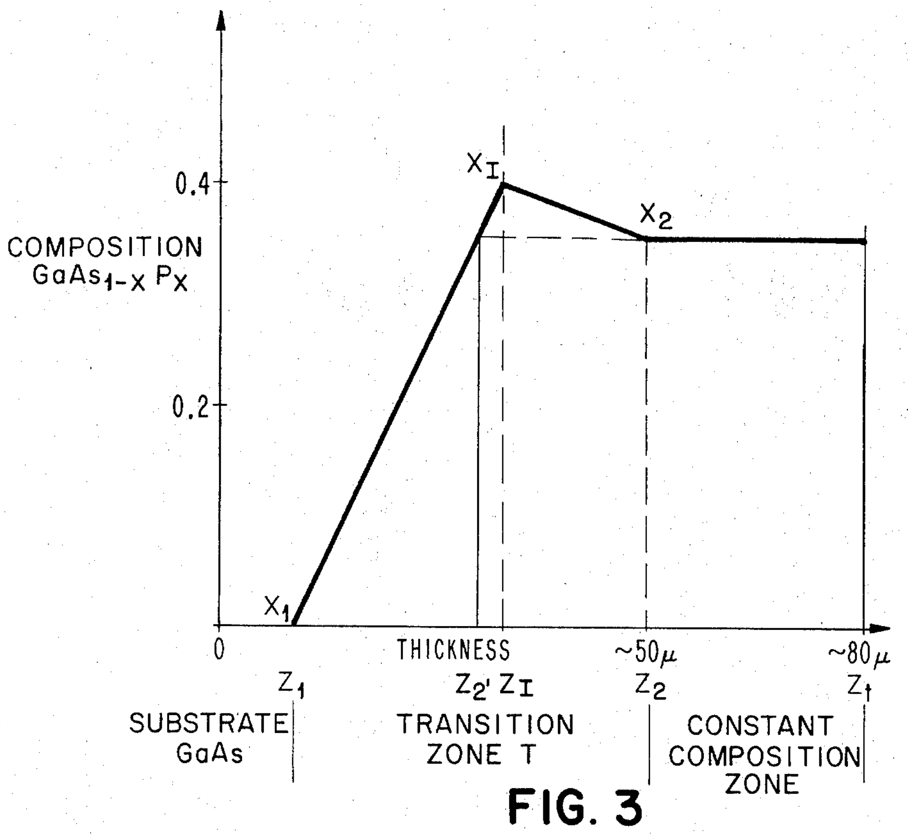
FIG. 3 is a plot of semiconductor wafer thickness in microns versus the composition of gallium arsenide phosphide in an illustrative III–V ternary semiconductor composition on a binary III–V substrate material.

Utilizing the composite grading method of this invention as diagramatically shown in FIG. 3, it will be apparent that if we linearly grade the composition to the final composition $X_2$ at some thickness $(Z_2' - Z_1)$, a residual strain will remain by incomplete compensation of lattice mismatch by misfit dislocations.

Therefore, in accordance with this invention, the grading is initially carried to some suitably chosen composition $X_I$ (where $X_I > X_2$), then we will have introduced more misfit dislocations, loosely proportional to $(a_I - a_1)/a_I$ instead of $(a_2 - a_1)/a_1$. Therefore, upon grading down again from $X_I$ to $X_2$, the misfit dislocations thus introduced will still remain and become sufficient for a complete compensation of lattice mismatch. If one so desires, one can also cause a convex bowing which is opposite in a sense to the customary concave bowing by choosing a very large $X_I$.

In order to obtain a flat composite ternary III–V compound wafer in accordance with this invention, the graded area firstly should be carried to a composition elemental ratio excess of between 5 and 15 percent beyond the desired ultimate constant composition followed by a downward grading from the excess graded point to the ultimate constant composition level desired, and the constant composition epitaxial growth continued, typically from 20 to 80 millimicrons thickness. This process procedure is graphically illustrated in FIG. 3 for gallium arsenide phosphide. If the excess graded area is in excess of the specified range, convex bowing might happen while concave bowing takes place for values below the specified range.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A method for the production of a substantially flat semiconductor structure, said structure consisting of a lattice substrate and first, second and third epitaxially grown thin films, said lattice substrate consisting of the elements A and B, said first, second and third films respectively consisting of the elements A, B and C, where A, B and C are respectively different elements selected from a plurality of elements and where said plurality of elements is limited to a group consisting of, boron, aluminum, gallium, and indium for the A elements, and phosphorus, arsenic, antimony and bismuth for the B and C elements, said method comprising: epitaxially growing said first film on said lattice substrate, where said first film has the formula $AB_{1-x}C_x$, where $x$ is the compositional gradient parameter having a value of approximately zero at the juncture of said first film and said lattice structure, and where $x$ increases to a value of $x_1$; epitaxially growing said second film on said first film, where said second film has the formula $AB_{1-x}C_x$, where $x$ is the compositional gradient parameter having a value of $x_1$ at the juncture of said first and second films, and where $x$ decreases to a value $x_2$; epitaxially growing said third film on said second film, where said third film has the formula $AB_{1-x}C_x$, where $x$ is the compositional gradient parameter and has a substantially constant value approximately equal to $x_3$; and where $x$ in said formula $AB_{1-x}C_x$, may have any value greater than zero and less than one, where $x_1$, $x_2$ and $x_3$ are respectively particular values of $x$, where $x_1$ is between 5 and 15 percent greater than $x_2$ and $x_3$ is approximately equal to $x_2$, whereby said semiconductor structure has its mechanical stresses substantially compensated thereby eliminating warping, or bowing, of said semiconductor structure.

2. A method for the production of a substantially flat semiconductor structure said structure consisting of a lattice substrate and first, second and third epitaxially grown thin films, said lattice substrate consisting of the elements A and B, said first, second and third films respectively consisting of the elements A, B and C, where A, B and C are respectively different elements selected from a plurality of elements and where said plurality of elements is limited to a group consisting of gallium and indium for the A elements and phosphorus and arsenic, for the B and C elements, said method comprising: epitaxially growing said first film on said lattice substrate, where said first film has the formula $AB_{1-x}C_x$, where $x$ is the compositional gradient parameter having a value of approximately zero at the juncture of said first film and said lattice structure, and where $x$ increases to a value of $x_1$; epitaxially growing said second film on said first film where said second film has the formula $AB_{1-x}C_x$, where $x$ is the compositional gradient parameter having a value of $x_1$ at the juncture of said first and second films, and where $x$ decreases to a value $x_2$; epitaxially growing said third film on said second film, where said third film has the formula $AB_{1-x}C_x$, where $x$ is the compositional gradient parameter and has a substantially constant value approximately equal to $x_3$; and where $x$ in said formula $AB_{1-x}C_x$ may have any value greater than zero and less than one, where $x_1$, $x_2$ and $x_3$ are respectively particular values of $x$, where $x_1$ is between 5 and 15 percent greater than $x_2$, and $x_3$ is approximately equal to $x_2$, whereby said semiconductor structure has its mechanical stresses substantially compensated thereby eliminating warping or bowing of said semiconductor structure.

3. A method for the production of composite flat epitaxial films of gallium arsenide phosphide on a gallium arsenide substrate, where said gallium arsenide phosphide has the formula Ga $As_{1-x}$ $P_x$ and $x$ is less than one and greater than zero, and wherein $x$ varies in magnitude in a non-linear relationship with respect to the sum thickness of said films, said method comprisng: growing a first epitaxial film of gallium arsenide phosphide of a first thickness on said gallium arsenide substrate and wherein $x$ varies within said first thickness from approximately zero to approximately 0.4; growing a second epitaxial film of gallium arsenide phosphide on said first epitaxial film of gallium arsenide phosphide, where said second film has a second thickness and wherein $x$ varies within said second thickness from approximately 0.4 to approximately 0.38; growing a third epitaxial film of gallium arsenide phosphide on said second epitaxial film of gallium arsenide phosphide, where said third film has a third thickness and wherein $x$ is approximately 0.38 throughout said third thickness, whereby warping or bowing of the structure comprising said gallium arsenide substrate and said first, second and third epitaxial films of gallium arsenide phosphide, is eliminated.

4. A method for the production of composite flat epitaxial films of indium arsenide phosphide on a indium arsenide substrate, where said indium arsenide phosphide has the formula In $As_{1-x}$ $P_x$ and $x$ is less than one and greater than zero, and wherein $x$ varies in magnitude in a non-linear relationship with respect to the sum thickness of said films, said method comprising: growing a first epitaxial film of indium arsenide phosphide of a first thickness on said indium arsenide substrate and wherein $x$ varies within said first thickness from approximately zero to approximately 0.4; growing a second epitaxial film of indium arsenide phosphide on said first epitaxial film of indium arsenide phosphide, where said second film has a second thickness and wherein $x$ varies within said second thickness from approximately 0.4 to approximately 0.38; growing a third epitaxial film of indium arsenide phosphide on said second epitaxial film of indium arsenide phosphide, where said third film has a third thickness and wherein $x$ is approximately 0.38 throughout said third thickness, whereby warping or bowing of the structure comprising said indium arsenide substrate and said first, second and third epitaxial films of indium arsenide phosphide is eliminated.

5. A method for producing a substantially flat semiconductor structure comprising first, second and third epitaxial films of gallium arsenide phosphide on a gallium arsenide substrate, where the composition of said gallium arsenide phosphide films each has the formula Ga $As_{1-x}P_x$ and where $x$ has the range of less than one and greater than zero, said method comprising: epitaxially growing said first film of gallium arsenide phosphide on said gallium arsenide substrate with $x$ equal to approximately zero at the juncture of said first film and said gallium arsenide substrate and $x$ equal to a value $x_1$ at the surface of said first film, and where $x_1$ is equal to or greater than 0.4 and less than one; epitaxially growing said second film of gallium arsenide phosphide on said first film with $x$ equal to approximately $x_1$ at the juncture of said first and second films and $x$ equal to a value $x_2$ at the surface of said second film, and where $x_2$ is less than $x_1$ and greater than 0.3; epitaxially growing said third film of gallium arsenide phosphide on said second film with $x$ having a substantially constant value $x_3$ throughout the thickness of said third film, where $x_3$ is approximately equal to $x_2$, whereby warping or bowing of said semiconductor structure, due primarily to a mismatch in lattice parameters, is eliminated.

6. A method for producing a substantially flat semiconductor structure comprising first, second and third epitaxial films of indium arsenide phosphide on a indium arsenide substrate, where the composition of said indium arsenide phosphide films each has the formula Ga $As_{1-x}P_x$ and where $x$ has the range of less than one and greater than zero, said method comprising: epitaxially growing said first film of indium arsenide phosphide on said indium arsenide substrate with $x$ equal to approximately zero at the juncture of said first film and said indium arsenide substrate and $x$ equal to a value $x_1$ at the surface of said first film, and where $x_1$ is equal to or greater than 0.4 and less than one; epitaxially growing said second film on indium arsenide phosphide on said first film with $x$ equal to approximately $x_1$ at the juncture of said first and second films and $x$ equal to a value $x_2$ at the surface of said second film, and where $x_2$ is less than $x_1$ and greater than 0.3; epitaxially growing said third film of indium arsenide phosphide on said second film with $x$ having a substantially constant value $x_3$ throughout the thickness of said third film, where $x_3$ is approximately equal to $x_2$, whereby warping or bowing of said semiconductor structure, due primarily to a mismatch in lattice parameters, is eliminated.

7. A method for producing a substantially flat semiconductor structure having at least first, second, and third epitaxial films of gallium arsenide phosphide on a semiconductor substrate of gallium arsenide, said first, second, and third films of gallium arsenide phosphide being grown upon, in the order recited, said gallium arsenide substrate, and where the formula for gallium arsenide phosphide for each of said films is Ga $As_{1-x}$ $P_x$, where $x$ is the compositional gradient parameter and may have any value less than one and greater than zero, said method comprising: growing said first epitaxial film of gallium arsenide phosphide on said gallim arsenide semiconductor substrate in a manner such that the compositional gradient parameter $x$ increases linearly with respect to the thickness of said first epitaxial film; growing said second epitaxial film on said first epitaxial film in a manner such that the compositional gradient parameter $x$ decreases linearly with respect to the thickness of said second epitaxial film; growing said third epitaxial film on said second epitaxial film in a manner such that the compositional gradient parameter $x$ is substantially constant throughout the thickness of said third film, wherein the final value of $x$ for the first epitaxial film is between 5 and 15 percent greater than the value of $x$ for the third epitaxial film, whereby warping, or bowing, of said semiconductor structure is eliminated.

8. A method for producing a substantially flat semiconductor structure having at least first, second and third epitaxial films of indium arsenide phosphide on a semiconductor substrate of indium arsenide, said first, second, and third films of indium arsenide phosphide being formed upon, in the order recited, said indium arsenide substrate, and where the formula for indium arsenide phosphide for each of said films is In $As_{1-x}$ $P_x$, where $x$ is the compositional gradient parameter and may have any value less than one and greater than zero, said method comprising: growing said first epitaxial film of indium arsenide phosphide on said indium arsenide semiconductor substrate in a manner such that the compositional gradient parameter $x$ increases linearly with respect to the thickness of said first epitaxial film; growing said second epitaxial film on said first epitaxial film in a manner such that the compositional gradient parameter $x$ decreases linearly with respect to the thickness of said second epitaxial film; growing said third epitaxial film on said second epitaxial film in a manner such that the compositional gradient parameter $x$ is substantially constant throughout the thickness of said third film, wherein the final value of $x$ for the first epitaxial film is between 5 and 15 percent greater than the value of $x$ for the third epitaxial film, whereby warping, or bowing, of said semiconductor structure is eliminated.

* * * * *